United States Patent
Liao et al.

(10) Patent No.: US 11,267,987 B2
(45) Date of Patent: Mar. 8, 2022

(54) CHEMICAL MECHANICAL POLISHING SLURRY COMPOSITION AND METHOD OF POLISHING METAL LAYER

(71) Applicant: Taiwan Semiconductor Manufacturing Co., Ltd., Hsinchu (TW)

(72) Inventors: Chun-Hung Liao, Taichung (TW); An-Hsuan Lee, Hsinchu (TW); Shen-Nan Lee, Hsinchu County (TW); Teng-Chun Tsai, Hsinchu (TW); Chen-Hao Wu, Hsinchu (TW); Huang-Lin Chao, Hillsboro, OR (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/805,864

(22) Filed: Mar. 2, 2020

(65) Prior Publication Data
US 2021/0130650 A1 May 6, 2021

Related U.S. Application Data

(60) Provisional application No. 62/928,312, filed on Oct. 30, 2019.

(51) Int. Cl.
| | | |
|---|---|---|
| C09G 1/02 | (2006.01) |
| H01L 21/8238 | (2006.01) |
| H01L 21/321 | (2006.01) |
| H01L 21/306 | (2006.01) |
| C09K 3/14 | (2006.01) |
| C09G 1/06 | (2006.01) |
| C09G 1/00 | (2006.01) |
| C09K 13/06 | (2006.01) |
| C09G 1/04 | (2006.01) |
| B24B 1/00 | (2006.01) |
| B24B 37/04 | (2012.01) |

(52) U.S. Cl.
CPC ............. *C09G 1/02* (2013.01); *B24B 1/00* (2013.01); *B24B 37/044* (2013.01); *C09G 1/00* (2013.01); *C09G 1/04* (2013.01); *C09G 1/06* (2013.01); *C09K 3/1454* (2013.01); *C09K 3/1463* (2013.01); *C09K 13/06* (2013.01); *H01L 21/30625* (2013.01); *H01L 21/3212* (2013.01); *H01L 21/823828* (2013.01)

(58) Field of Classification Search
None
See application file for complete search history.

(56) References Cited

U.S. PATENT DOCUMENTS

2006/0207635 A1* 9/2006 Bian .................. C09G 1/02 134/42
2010/0216309 A1* 8/2010 Minami ............ H01L 21/30625 438/693

* cited by examiner

*Primary Examiner* — Jiong-Ping Lu
(74) *Attorney, Agent, or Firm* — JCIPRNET

(57) ABSTRACT

A CMP slurry composition and a method of polishing a metal layer are provided. In some embodiments, the CMP slurry composition includes about 0.1 to 10 parts by weight of a metal oxide, and about 0.1 to 10 parts by weight of a chelator. The chelator includes a thiol compound or a thiolether compound.

20 Claims, 6 Drawing Sheets

CHEMICAL MECHANICAL POLISHING SLURRY COMPOSITION AND METHOD OF POLISHING METAL LAYER

CROSS-REFERENCE TO RELATED APPLICATION

This application claims the priority benefit of U.S. provisional application Ser. No. 62/928,312, filed on Oct. 30, 2019. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, some transition metal elements such as ruthenium (Ru) become important materials because their superior features of low resistance under small cross-sectional area and barrier-less adhesion ability. Although these transition metal elements provide great electrical properties, their inert characteristics such as higher hardness make them difficult to process, specifically in a chemical mechanical polishing (CMP) process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
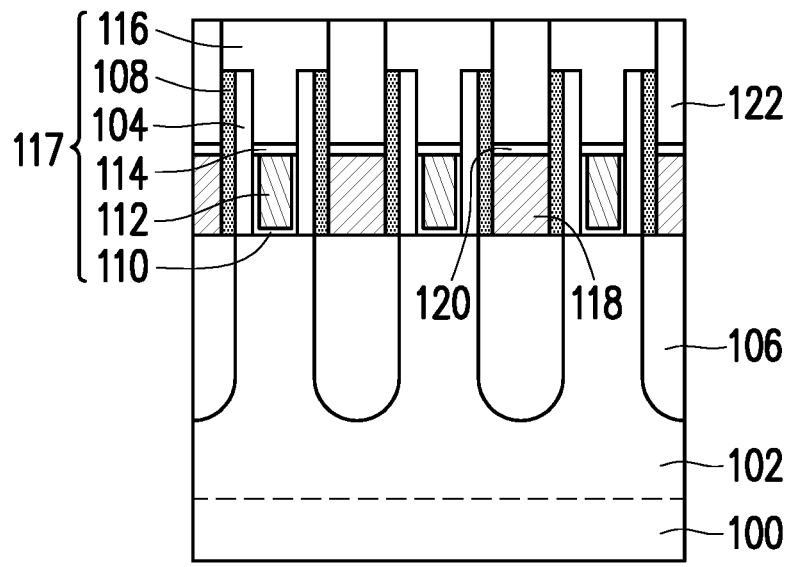
FIG. 1 to FIG. 7 are schematic cross-sectional views of a method of polishing a metal layer in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 7 are schematic cross-sectional views of a method of polishing a metal layer in accordance with some embodiments. The following embodiments in which the method of the disclosure is applied to a process of forming a fin field-effect transistor (FinFET) device are provided for illustration purposes, and are not construed as limiting the present disclosure. In other embodiments, the method of the disclosure may be applied to a process of forming a planar device or a gate-all-around (GAA) device.

Referring to FIG. 1, a substrate 100 with one or more fins 102 is provided. In some embodiments, the substrate 100 includes a silicon-containing substrate, a silicon-on-insulator (SOI) substrate, or a substrate formed of other suitable semiconductor materials. Depending on the requirements of design, the substrate 100 may be an N-type substrate or a P-type substrate and may have doped regions therein. The doped regions may be configured for an N-type FinFET device or a P-type FinFET device. In some embodiments, the substrate 100 has an isolation layer formed thereon. Specifically, the isolation layer covers lower portions of the fins 102 and exposes upper portions of the fins 102. In some embodiments, the isolation layer is a shallow trench isolation (STI) structure.

In some embodiments, the substrate 100 has multiple gate structures 117 formed thereon, strained layers 106 formed therein, metal stacks between the gate structures 117, and a zeroth dielectric layer 122 formed aside the gate structures 117 and over the strained layers 106. In some embodiments, each of the gate structures 117 includes a gate electrode 112, a gate dielectric layer 110 between the gate electrode 112 and the substrate 100, a spacer 104 on the sidewall of the gate electrode 112, an etching stop layer 108 between the spacer 104 and the zeroth dielectric layer 122, and a dielectric helmet 116 over the gate electrode 112.

In some embodiments, the method of forming the intermediate structure of FIG. 1 includes forming multiple dummy gate strips across the fins 102, forming spacers 104 on the sidewalls of the dummy gate strips, forming strained layers 106 at two sides of each fin 102, forming a sacrificial dielectric layer aside the dummy gate strips and over the strained layers 106, and replacing the dummy gate strips with metal gate strips.

In some embodiments, the dummy gate strips include a silicon-containing material, such as polysilicon, amorphous silicon or a combination thereof. In some embodiments, the dummy gate strips extend in a direction different from (e.g., perpendicular to) the extending direction of the fins 102.

In some embodiments, the spacers 104 include a nitrogen-containing dielectric material, a carbon-containing dielectric material or both, and the spacers 104 include a low-k material having a dielectric constant less than about 4 or about 3.5.

In some embodiments, the strained layers 106 include silicon carbon (SiC), silicon phosphate (SiP), SiCP or a SiC/SiP multi-layer structure for an N-type FinFET device. In alternative embodiments, the strained layers 106 include silicon germanium (SiGe) for a P-type FinFET device. In some embodiments, the strained layers 106 can be referred to as "source/drain regions".

In some embodiments, the sacrificial dielectric layer includes nitride such as silicon nitride, oxide such as silicon oxide, phosphosilicate glass (PSG), borosilicate glass (BSG), boron-doped phosphosilicate glass (BPSG), the like, or a combination thereof. In some embodiments, an etching stop layer 108 is formed after the step of forming the strained layers 106 and before the step of forming the sacrificial dielectric layer. In some embodiments, the etching stop layer 108 includes SiN, SiC or the like. In some embodiments, the etching stop layer 108 is referred to as "contact etching stop layers (CESL)". In some embodiments, the top surface of the sacrificial dielectric layer is substantially level with the top surfaces of the dummy gate strips.

Thereafter, the dummy gate strips are replaced with metal gate strips. In some embodiments, the dummy gate strips are removed to form gate trenches in the sacrificial dielectric layer, and the metal gate strips are then formed in the gate trenches. In some embodiments, the top surface of the sacrificial dielectric layer is substantially level with the top surfaces of the metal gate strips.

In some embodiments, each of the metal gate strips includes a gate dielectric layer 110 and a gate electrode 112 (or called "replacement gate") on the gate dielectric layer 110. In some embodiments, the metal gate strips extend in a direction different from (e.g., perpendicular to) the extending direction of the fins 102. In some embodiments, each of the gate dielectric layers 110 surrounds the sidewall and bottom of the corresponding gate electrode 112 and on the top and sidewall of the corresponding fin 102, as shown in FIG. 1. In some embodiments, interfacial layers such as silicon oxide layers are formed between the fins 102 and the gate dielectric layers 110.

In some embodiments, the gate dielectric layers 110 include a high-k material having a dielectric constant greater than about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2Os$, $Y_2O_3$, STO, BTO, BaZrO, HfZrO, HfLaO, HfTaO, HfTiO, the like, or a combination thereof. In some embodiments, the gate dielectric layers 110 can optionally include a silicate such as HfSiO, LaSiO, AlSiO, the like, or a combination thereof.

In some embodiments, each of the gate electrodes 112 includes a work function metal layer and a fill metal layer on the work function metal layer. In some embodiments, the work function metal layer is an N-type work function metal layer to provide a gate electrode that properly performs in an N-type FinFET device. The N-type work function metal layer may include TiAl, TiAlN, TiAlC, TaAl, TaAlC, TaAlN, TaCN, the like, or a combination thereof. In alternative embodiments, the work function metal layer is a P-type work function metal layer to provide a gate electrode that properly performs in a P-type FinFET device. The P-type work function metal layer may include TiN, WN, TaN, the like, or a combination thereof. The fill metal layer includes copper (Cu), aluminum (Al), tungsten (W), or a suitable material. In some embodiments, each of the gate electrodes 112 can further include a liner layer, an interface layer, a seed layer, an adhesion layer, a barrier layer, the like, or a combination thereof.

In some embodiments, the method of forming the intermediate structure of FIG. 1 further includes partially removing the metal gate strips, the spacers 104 and the etching stop layer 108 to form T-shaped gate openings in the sacrificial dielectric layer, forming dielectric helmets 116 in the T-shaped gate openings, removing the sacrificial dielectric layer, forming metal stacks 118 between the remaining metal gate strips, and forming a zeroth dielectric layer 122 around the remaining metal gate strips.

In some embodiments, the dielectric helmets 116 include a metal oxide, a metal nitride, a nitride, a silicon-containing material or a combination thereof. The metal oxide may include $ZrO_2$, $HfO_2$, $TiO_2$, $Al_2O_3$ or the like. The metal nitride may include ZrN, HfN, TiN, MN or the like. The nitride may include silicon nitride. The silicon-containing material includes polysilicon, amorphous silicon or a combination thereof. In some embodiments, the dielectric helmets 116 serve as "polishing stop layers", which will be described in details below.

In some embodiments, optional shielding layers 114 are respectively formed between the gate electrodes 112 and the dielectric helmets 116. In some embodiments, the shielding layers 114 include metal such as tungsten (W), cobalt (Co), copper (Cu), titanium (Ti) or the like. The shielding layers 114 are configured to protect the gate electrodes 112 from being damaged by the subsequent processes. In some embodiments, the shielding layers 114 are referred to as "contact etching stop layers (CESL)".

In some embodiments, the sacrificial dielectric layer and a portion of the etching stop layer 108 are removed to form gaps that expose the strained layers 106. The metal stacks 118 are formed in the lower portions of the gaps. In some embodiments, the top surfaces of the metal stacks 118 are substantially coplanar with the top surfaces of the gate electrodes 112. In some embodiments, the metal stacks 126 include metal such as tungsten (W), cobalt (Co), copper (Cu), titanium (Ti) or the like.

In some embodiments, the zeroth dielectric layer 122 includes nitride such as silicon nitride, oxide such as silicon oxide, phosphosilicate glass (PSG), borosilicate glass (BSG), boron-doped phosphosilicate glass (BPSG), the like, or a combination thereof. In some embodiments, a zeroth dielectric material layer is formed on the substrate 100 filling the gaps between the gate structures 117 by a suitable technique such as spin-coating, CVD, ALD, the like, or a combination thereof. Thereafter, the zeroth dielectric material layer is planarized by a suitable technique such as CMP, until tops of the gate structures 117 are exposed. In some embodiments, the top surface of the zeroth dielectric layer 122 is substantially level with the top surfaces of the dielectric helmets 116 of the gate structures 117. In some embodiments, the zeroth dielectric layer 122 serves as a "polishing stop layer", which will be described in details below.

In some embodiments, optional shielding layers 120 are respectively formed between the metal stacks 118 and the zeroth dielectric layer 122. In some embodiments, the shielding layers 120 include metal such as tungsten (W), cobalt (Co), copper (Cu), titanium (Ti) or the like. The shielding layers 120 are configured to protect the metal stacks 118 from being damaged by the subsequent processes. In some embodiments, the shielding layers 120 are referred to as "contact etching stop layers (CESL)".

Figure 2:
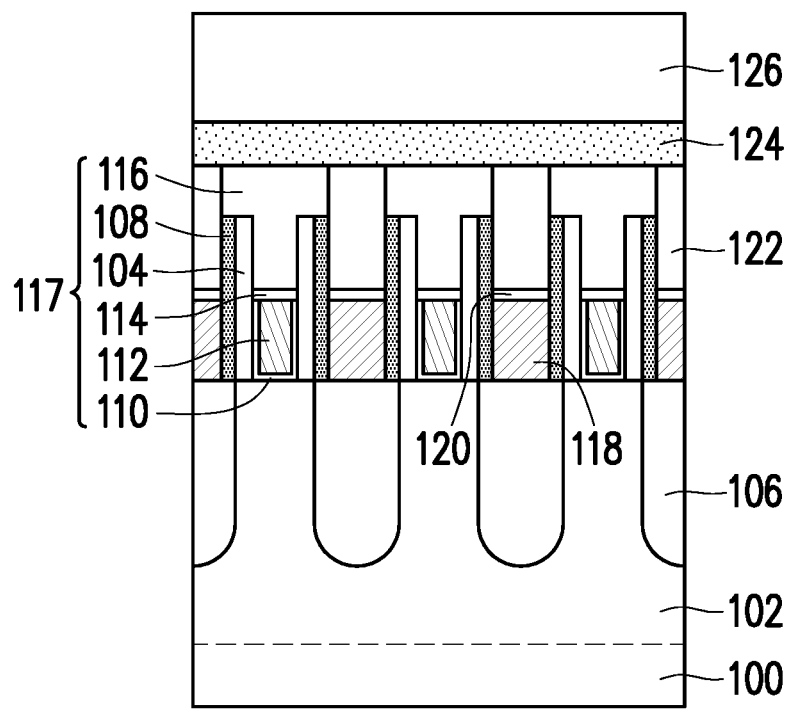

Referring to FIG. 2, a first dielectric layer 124 is formed over the zeroth dielectric layer 122. In some embodiments, the first dielectric layer 124 is blanket-formed on the substrate 100 and in physical contact with the dielectric helmets 116 and the zeroth dielectric layer 122. In some embodiments, the first dielectric layer 124 includes SiN, SiCN, SiON, SiOCN, SiOC, SiC, the like, or a combination thereof. In some embodiments, the method of forming the first dielectric layer 124 includes performing a suitable technique such as spin-coating, CVD, ALD, the like, or a combination thereof. In some embodiments, the first dielectric layer 124 serves as a "polishing stop layer", which will be described in details below.

Thereafter, a second dielectric layer 126 is formed over the first dielectric layer 124. In some embodiments, the second dielectric layer 126 is blanket-formed on the first dielectric layer 124. In some embodiments, the second dielectric layer 126 includes nitride such as silicon nitride, oxide such as silicon oxide, phosphosilicate glass (PSG), borosilicate glass (BSG), boron-doped phosphosilicate glass (BPSG), the like, or a combination thereof. In some embodiments, the method of forming the second dielectric layer 126 includes performing a suitable technique such as spin-coating, CVD, ALD, the like, or a combination thereof. In some embodiments, the second dielectric layer 126 serves as a "polishing stop layer", which will be described in details below.

In some embodiments, the second dielectric layer 126 includes a material similar to the zeroth dielectric layer 122 but different from that of the first dielectric layer 124. In some embodiments, the polishing rate of the material included in the second dielectric layer 126 is similar to the polishing rate of the material included in the zeroth dielectric layer 122 but different from the polishing rate of the material included in the first dielectric layer 124.

Figure 3:
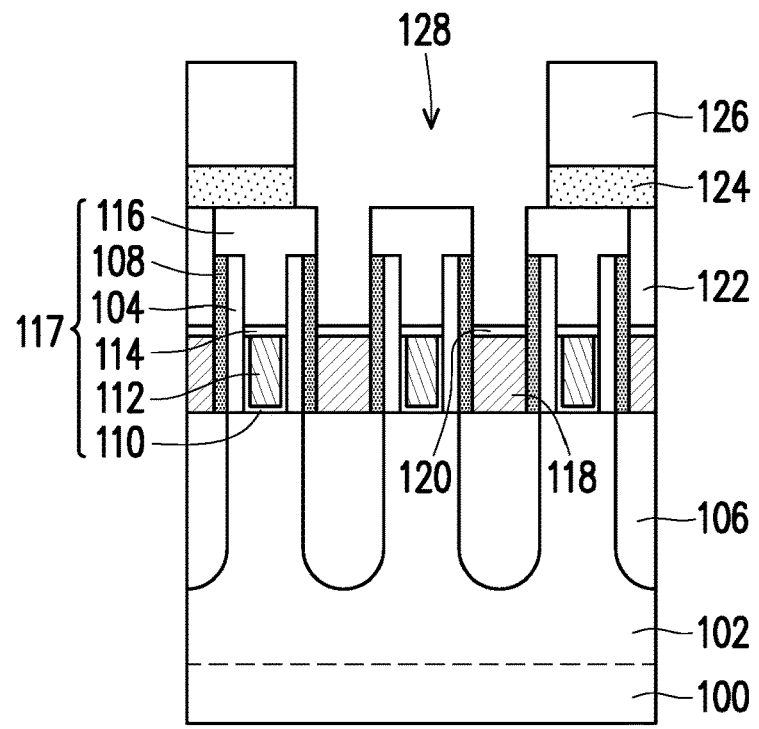

Referring to FIG. 3, the second dielectric layer 126, the first dielectric layer 124 and the zeroth dielectric layer 122 are patterned or partially removed, so as to form at least one opening 128 corresponding to one or more of the strained layers 106. In some embodiments, the opening 128 penetrates through the second dielectric layer 126, the first dielectric layer 124 and the zeroth dielectric layer 122 and exposes two shielding layers 120. In some embodiments, the patterning step includes forming a mask layer over the second dielectric layer 126, and performing an etching process (e.g., dry etching process) by using the mask layer as an etching mask. In some embodiments, the opening 128 has a main trench and multiple holes (or called "contact hole") protruding from the main trench.

Figure 4:
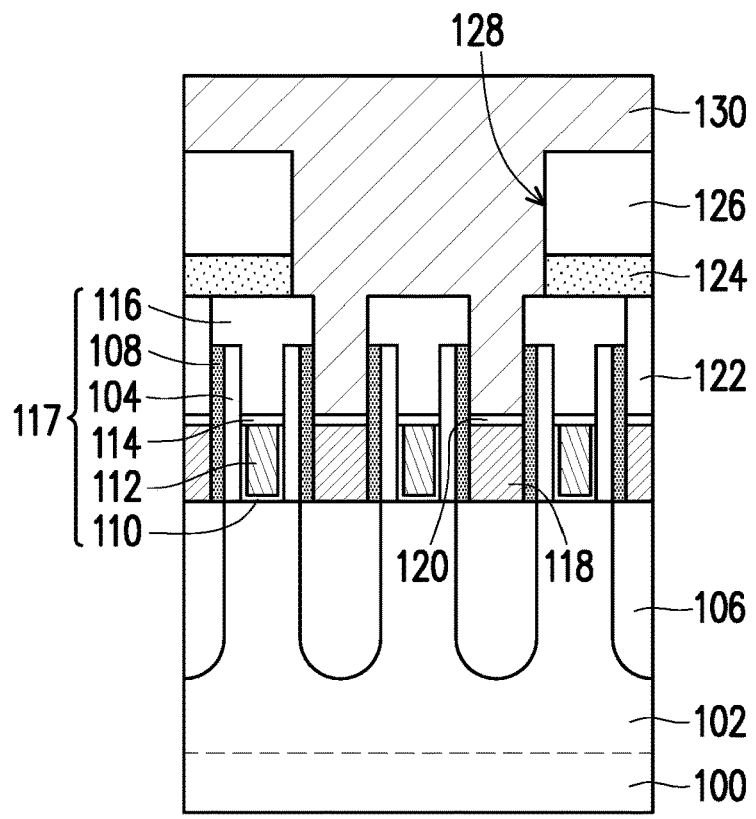

Referring to FIG. 4, a metal layer 130 is formed over the substrate 100 filling in the opening 128. In some embodiments, the metal layer 130 includes a metal material with suitable resistance and gap-fill capability. In some embodiments, the metal layer 130 includes a transition metal element with low resistance and barrier-less adhesion ability. In some embodiments, the metal layer 130 includes RuCo, RuW, Ru, Mo, Rh or Ir. In some embodiments, the Ru atom content of the metal layer 130 ranges from about 10 at % to 100 at %. In some embodiments, the method of forming the metal layer 130 includes performing sputtering, CVD, electrochemical plating (ECP), the like, or a combination thereof.

Figure 5:
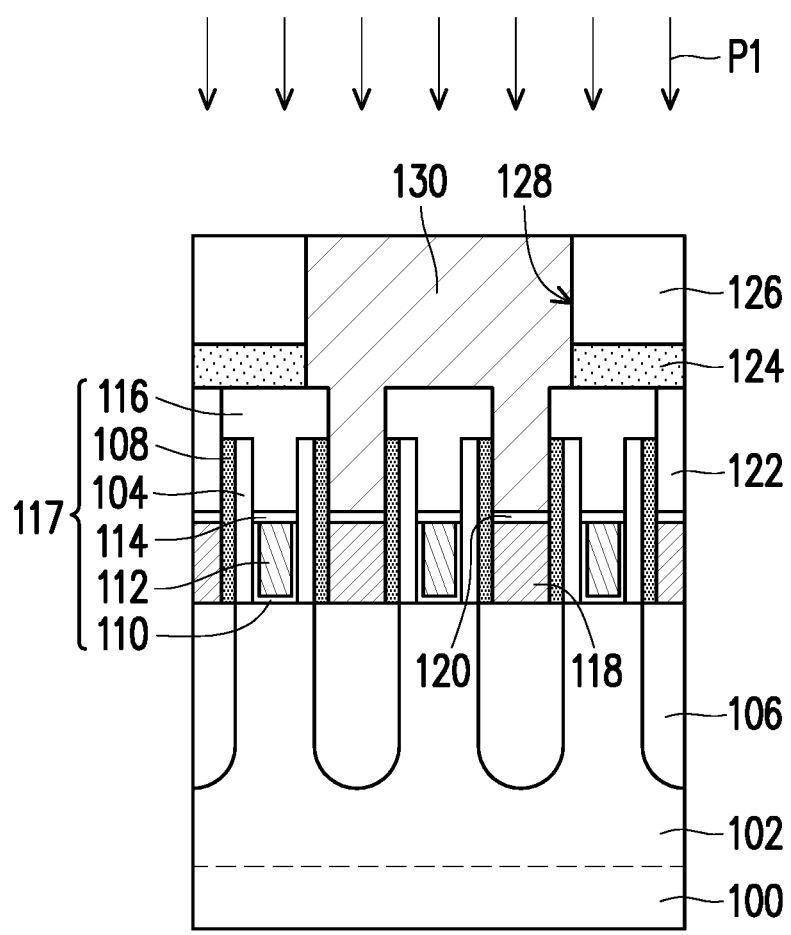

Referring to FIG. 5, a first polishing operation P1 is performed with a first polishing slurry composition, until the top surface of the second dielectric layer 126 is exposed. In some embodiments, the first polishing operation P1 is performed by using the second dielectric layer 126 as a polishing stop layer. In some embodiments, the first polishing operation P1 is configured to polish a Ru-based material or the like by using an oxide-based material as a polishing stop layer.

In some embodiments, the first polishing slurry composition includes about 0.1 to 10 parts by weight of a metal oxide, and about 0.1 to 10 parts by weight of an oxidizer. In some embodiments, the metal oxide serves as an abrasive and includes $TiO_2$ in an amount of about 1 to 5 parts by weight. In some embodiments, the oxidizer serves as a polishing accelerator and includes $H_2O_2$, $KIO_3$, $KIO_4$, $KClO_3$, $KClO_4$ or a combination thereof, in an amount of about 1 to 5 parts by weight.

In some embodiments, the first polishing slurry composition further includes about 0.1 to 10 parts by weight of a pH adjustor. In some embodiments, the pH adjustor includes KOH or $R_1$—N—$R_2$, wherein $R_1$ and $R_2$ each independently represent hydrogen, substituted or unsubstituted $C_1$-$C_{15}$ alkyl, substituted or unsubstituted $C_1$-$C_{15}$ alkoxyl or substituted or unsubstituted $C_6$-$C_{30}$ aryl, in an amount of about 1 to 5 parts by weight. In some embodiments, the pH value of the first polishing slurry composition is from about 7 to 12.

In some embodiments, the first polishing slurry composition further includes about 0 to 5 parts by weight of a pH buffer, and about 0 to 10 parts by weight of a surfactant. In some embodiments, the pH buffer includes organic acid, such as citric acid, acetic acid, in an amount of about 1 to 3 parts by weight. In some embodiments, the surfactant includes organic acid (e.g., citric acid, acetic acid) or alcohol (e.g., ethanol), in an amount of about 1 to 3 parts by weight. In some embodiments, the pH buffer and the surfactant are optional, and can be omitted as needed.

Figure 6:
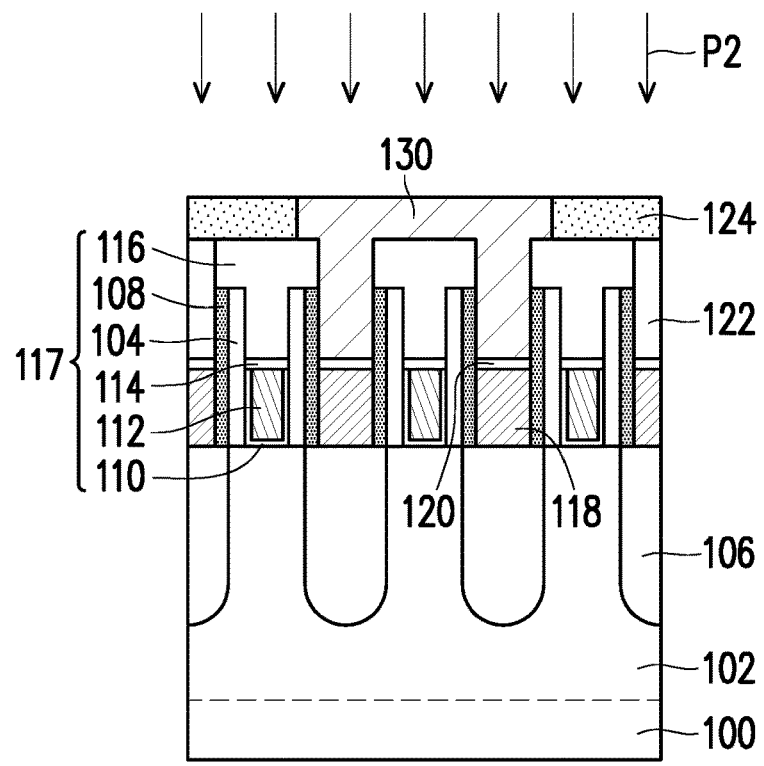

Referring to FIG. 6, a second polishing operation P2 is performed with a second polishing slurry composition, until the top surface of the first dielectric layer 124 is exposed. In some embodiments, the second polishing operation P2 is performed by using the first dielectric layer 124 as a polishing stop layer. In some embodiments, the second polishing operation P2 is configured to polish a Ru-based material or the like by using a nitride-based material as a polishing stop layer. In some embodiments, the oxide-based material is simultaneously removed during the second polishing operation P2.

In some embodiments, the second polishing slurry composition includes about 0.1 to 10 parts by weight of a metal oxide, and about 0.1 to 10 parts by weight of a chelator. In some embodiments, the metal oxide serves as an abrasive and includes cerium oxide ($CeO_2$), cerium hydroxide, cerium nitride, cerium fluoride or cerium sulfide, in an amount of about 1 to 5 parts by weight. In some embodiments, the chelator serves as a polishing accelerator and includes a thiol compound or a thiolether compound in an amount of about 1 to 5 parts by weight.

In some embodiments, an oxidant is not present in the second polishing slurry composition. Rather, the chelator including a thiol compound or a thiolether compound is used instead. In some embodiments, due to the chemical inertness and high Mohs hardness of a transition metal (e.g. Ru), the polishing operation becomes difficult. However, most of the oxidizing agents cannot apply to such ceria-type slurry, because these oxidizing agents would cause ceria abrasive particles to agglomerate. The lone pairs of thiolether groups of the chelator donate the electrons to form coordinate covalent bonds with empty orbits of Ru. Such covalent bonds, unlike metallic bonds, are directional. Strong bond energy will induce electrons to redistribute and cluster at the S—Ru side, so that Ru—Ru bonds along the σ bond axis would be weakened (so-called "trans effect"). Specifically, after the thiolether groups of the chelator form coordinate covalent bonds with Ru, the thiolether-Ru complex layer around the top surface becomes easier to be removed due to the trans-effect. Since the Ru atoms around the top surface lose bonding strength with under-layer atoms, the Ru surface is able to be removed by abrasive abrasion.

In some embodiments, the chelator is represented by a formula of $R_1$—S—$R_2$, wherein $R_1$ and $R_2$ each independently represent hydrogen, substituted or unsubstituted $C_1$-$C_{15}$ alkyl, substituted or unsubstituted $C_1$-$C_{15}$ alkoxyl or substituted or unsubstituted $C_6$-$C_{30}$ aryl. In some embodiments, an alkyl group is a stronger electron pusher toward the central sulfur atom than hydrogen. Therefore, the central sulfur atom becomes more electron rich when the side group is an alkyl group rather than a hydrogen. Such sulfur atom has higher tendency to donate its electrons and forms a coordinate covalent bond with empty orbits of Ru, and thus, the removal rate (RR) of the CMP process is accordingly improved.

In some embodiments, the second polishing slurry composition further includes about 0.1 to 10 parts by weight of a pH adjustor. In some embodiments, the pH adjustor includes KOH or $R_1$—N—$R_2$, wherein $R_1$ and $R_2$ each independently represent hydrogen, substituted or unsubstituted $C_1$-$C_{15}$ alkyl, substituted or unsubstituted $C_1$-$C_{15}$ alkoxyl or substituted or unsubstituted $C_6$-$C_{30}$ aryl, in an amount of about 1 to 5 parts by weight. In some embodiments, the pH value of the second polishing slurry composition is from about 7 to 12.

In some embodiments, the second polishing slurry composition further includes about 0 to 5 parts by weight of a pH buffer, and about 0 to 10 parts by weight of a surfactant. In some embodiments, the pH buffer includes organic acid, such as citric acid, acetic acid, in an amount of about 1 to 3 parts by weight. In some embodiments, the surfactant includes organic acid (e.g., citric acid, acetic acid) or alcohol (e.g., ethanol), in an amount of about 1 to 3 parts by weight. In some embodiments, the pH buffer and the surfactant are optional, and can be omitted as needed.

Figure 7:
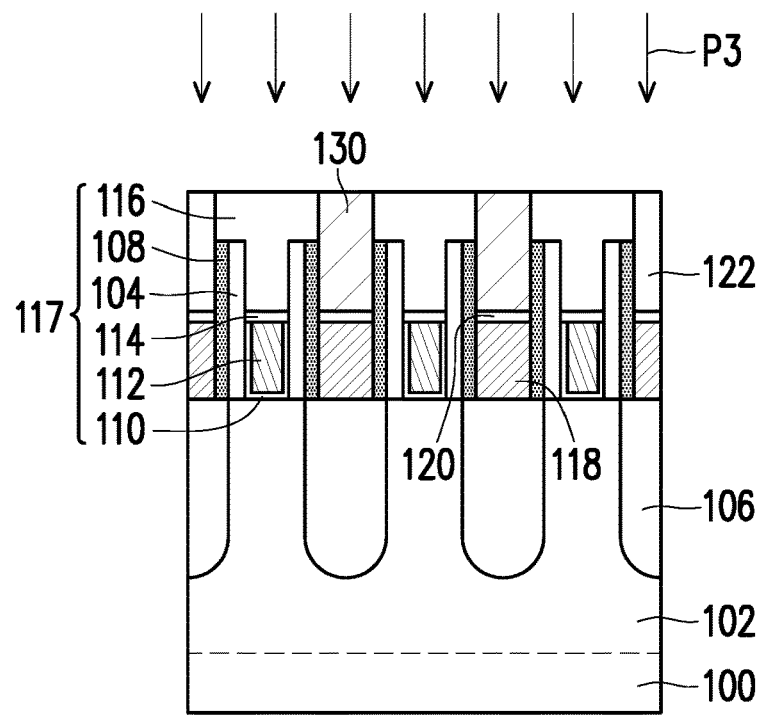

Referring to FIG. 7, a third polishing operation P3 is performed with a third polishing slurry composition, until the top surfaces of the dielectric helmets 116 of the gate structures 117 are exposed. In some embodiments, the third polishing operation P3 is performed by using the dielectric helmets 116 and the zeroth dielectric layer 122 as polishing stop layers. In some embodiments, the third polishing operation P3 is configured to polish a Ru-based material or the like by using a mixed layer of nitride-based and oxide-based materials as a polishing stop layer. In some embodiments, the nitride-based material (or carbon-based material) is simultaneously removed during the third polishing operation P3.

In some embodiments, the third polishing slurry composition includes about 0.1 to 10 parts by weight of a metal oxide, and about 0.1 to 10 parts by weight of an oxidizer. In some embodiments, the metal oxide serves as an abrasive and includes $SiO_2$ in an amount of about 1 to 5 parts by weight. In some embodiments, the oxidizer serves as a polishing accelerator and includes $H_2O_2$, $KIO_3$, $KIO_4$, $KClO_3$, $KClO_4$ or a combination thereof, in an amount of about 1 to 5 parts by weight.

In some embodiments, the third polishing slurry composition further includes about 0.1 to 10 parts by weight of a pH adjustor. In some embodiments, the pH adjustor includes KOH or $R_1$—N—$R_2$, wherein $R_1$ and $R_2$ each independently represent hydrogen, substituted or unsubstituted $C_1$-$C_{15}$ alkyl, substituted or unsubstituted $C_1$-$C_{15}$ alkoxyl or substituted or unsubstituted $C_6$-$C_{30}$ aryl, in an amount of about 1 to 5 parts by weight. In some embodiments, the pH value of the first polishing slurry composition is from about 7 to 12.

In some embodiments, the third polishing slurry composition further includes about 0 to 5 parts by weight of a pH buffer, and about 0 to 10 parts by weight of a surfactant. In some embodiments, the pH buffer includes organic acid, such as citric acid, acetic acid, in an amount of about 1 to 3 parts by weight. In some embodiments, the surfactant includes organic acid (e.g., citric acid, acetic acid) or alcohol (e.g., ethanol), in an amount of about 1 to 3 parts by weight. In some embodiments, the pH buffer and the surfactant are optional, and can be omitted as needed.

Upon the first to third polishing operations P1 to P3, the remaining metal layer 130 constitute contacts (or called "vias" in some examples) between the gate structures 117. A FinFET device of the disclosure is thus completed.

The above embodiments in which the chelator of the disclosure is not included in each of the first polishing slurry composition and the third polishing slurry composition are provided for illustration purposes, and are not construed as limiting the present disclosure. In other embodiments, each of the first polishing slurry composition and the third polishing slurry composition can further include about 0.1 to 10 parts by weight of a chelator. In some embodiments, the chelator serves as a polishing accelerator and includes a thiol compound or a thiolether compound in an amount of about 1 to 5 parts by weight. In some embodiments, the chelator is represented by a formula of $R_1$—S—$R_2$, wherein $R_1$ and $R_2$ each independently represent hydrogen, substituted or unsubstituted $C_1$-$C_{15}$ alkyl, substituted or unsubstituted $C_1$-$C_{15}$ alkoxyl or substituted or unsubstituted $C_6$-$C_{30}$ aryl.

Figure 8:
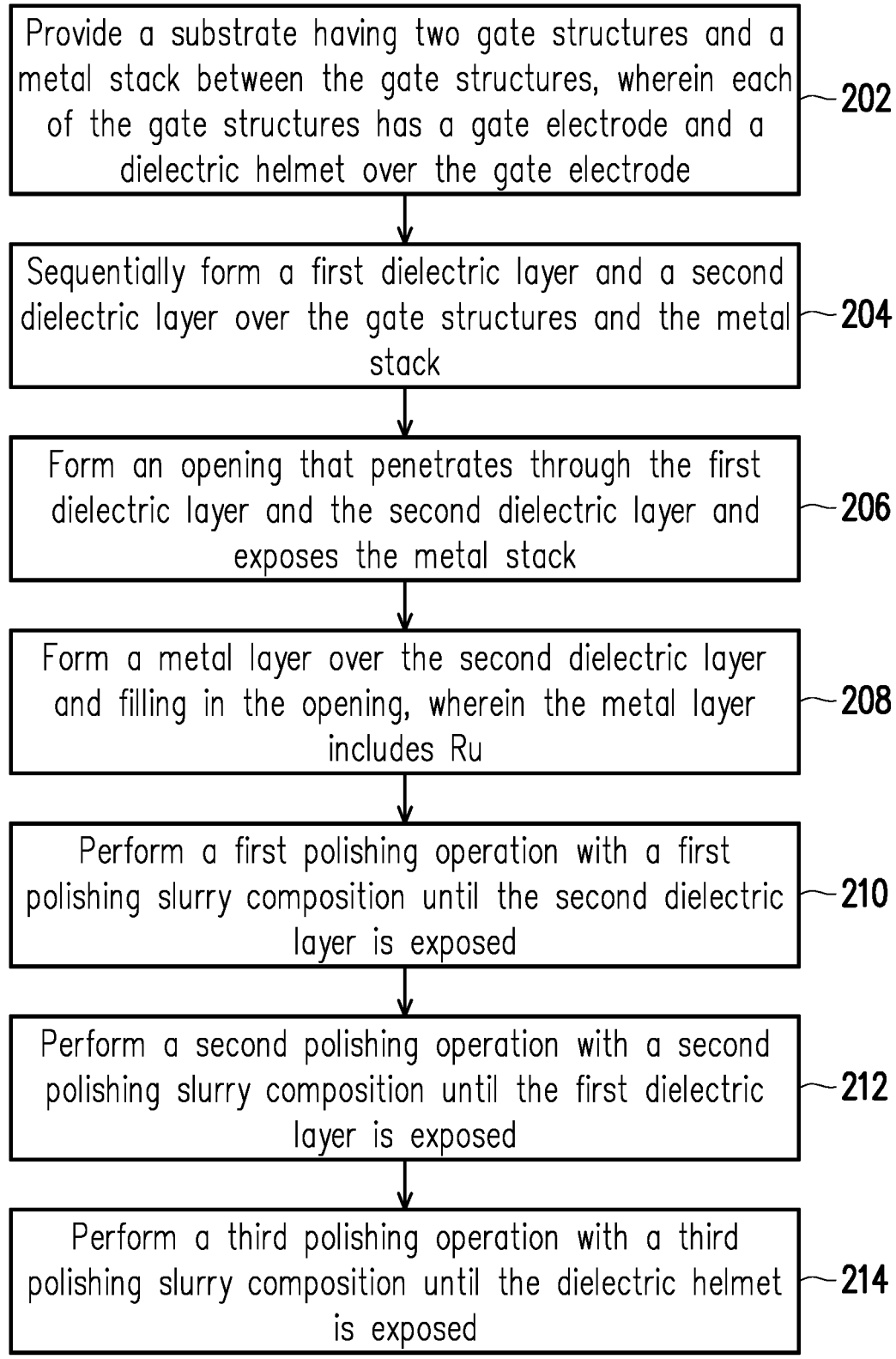
FIG. 8 is a process flow of a method of polishing a metal layer in accordance with some embodiments.

FIG. 8 is a process flow of a method of polishing a metal layer in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 202, a substrate is provided, and the substrate has two gate structures and a metal stack between the gate structures, wherein each of the gate structures has a gate electrode and a dielectric helmet over the gate electrode. FIG. 1 illustrates a cross-sectional view corresponding to some embodiments of act 202.

At act 204, a first dielectric layer and a second dielectric layer are sequentially formed over the gate structures and the metal stack. FIG. 2 illustrates a cross-sectional view corresponding to some embodiments of act 204.

At act 206, an opening is formed to penetrate through the first dielectric layer and the second dielectric layer and exposes the metal stack. FIG. 3 illustrates a cross-sectional view corresponding to some embodiments of act 206.

At act 208, a metal layer is formed over the second dielectric layer and fills in the opening, wherein the metal layer includes Ru. FIG. 4 illustrates a cross-sectional view corresponding to some embodiments of act 208.

At act 210, a first polishing operation is performed with a first polishing slurry composition until the second dielectric layer is exposed. FIG. 5 illustrates a cross-sectional view corresponding to some embodiments of act 210.

At act 212, a second polishing operation is performed with a second polishing slurry composition until the first dielectric layer is exposed. FIG. 6 illustrates a cross-sectional view corresponding to some embodiments of act 212.

At act 214, a third polishing operation is performed with a third polishing slurry composition until the dielectric helmet is exposed. FIG. 7 illustrates a cross-sectional view corresponding to some embodiments of act 214.

Figure 9:
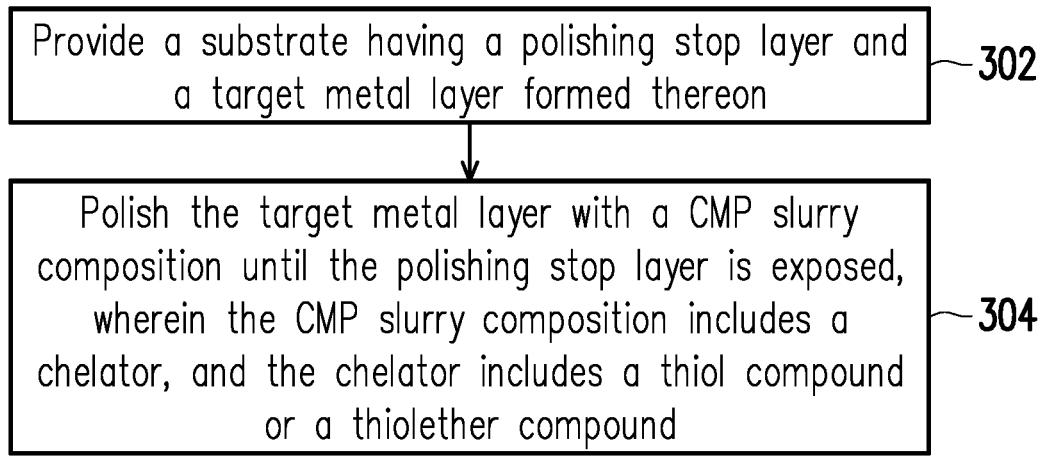
FIG. 9 is a process flow of a method of polishing a metal layer in accordance with alternative embodiments.

FIG. 9 is a process flow of a method of polishing a metal layer in accordance with alternative embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 302, a substrate is provided, and the substrate has a polishing stop layer and a target metal layer formed thereon. FIG. 1 to FIG. 4 illustrate cross-sectional views corresponding to some embodiments of act 302.

At act 304, the target metal layer is polished with a CMP slurry composition until the polishing stop layer is exposed, wherein the CMP slurry composition includes a chelator, and the chelator includes a thiol compound or a thiolether compound.

FIG. 6 illustrates a cross-sectional view corresponding to some embodiments of act 304. In some embodiments, as shown in FIG. 6, the metal layer 130 is polished, using the first dielectric layer 124 as a polishing stop layer, with a second polishing slurry composition including $CeO_2$ particles and the above-mentioned chelator. In some embodiments, the first dielectric layer 124 includes a nitride-based or carbon-based material such as SiN, SiCN, SiON, SiOCN, SiOC or SiC. In some embodiments, the first dielectric layer 124 includes a silicon atom content of 20-70 at %, a nitrogen atom content of 0-60 at %, a carbon atom content of 0-50 at %, and an oxygen content of 0-60 at %. In this example, an oxidizer is not present in the CMP slurry composition.

FIG. 5 illustrates a cross-sectional view corresponding to alternative embodiments of act 304. In some embodiments, as shown in FIG. 5, the metal layer 130 is polished, using the second dielectric layer 126 as a polishing stop layer, with a first polishing slurry composition including $TiO_2$ particles, an oxidizer and the above-mentioned chelator. In some embodiments, the second dielectric layer 126 includes an oxide-based material such as $SiO_2$.

FIG. 7 illustrates a cross-sectional view corresponding to yet alternative embodiments of act 304. In some embodiments, as shown in FIG. 7, the metal layer 130 is polished, using the zeroth dielectric layer 122 and dielectric helmets 116 as polishing stop layers, with a third polishing slurry composition including $SiO_2$ particles, an oxidizer and the above-mentioned chelator. In some embodiments, the zeroth dielectric layer 122 includes an oxide-based material such as $SiO_2$, and the dielectric helmets 116 include $ZrO_2$, SiN or silicon.

The transition metal element with low resistivity (such as ruthenium) is promising for the next-generation via material. However, the chemical inertness and high hardness make it difficult for Ru to integrate to a CMP process. In the disclosure, a thiol-containing or thiolether-containing chelator is added to a CMP slurry composition, so as to help boost the Ru removal rate and enable Ru to integrate to a via loop.

In accordance with some embodiments of the present disclosure, a CMP slurry composition includes about 0.1 to 10 parts by weight of a metal oxide, and about 0.1 to 10 parts by weight of a chelator. The chelator includes a thiol compound or a thiolether compound.

In accordance with alternative embodiments of the present disclosure, a method of polishing a metal layer includes the following operations. A substrate is provided, and the substrate has a polishing stop layer and a target metal layer formed thereon. The target metal layer is polished with a CMP slurry composition until the polishing stop layer is exposed, wherein the CMP slurry composition includes a chelator, and the chelator includes a thiol compound or a thiolether compound.

In accordance with yet alternative embodiments of the present disclosure a method of polishing a metal layer includes the following operations. A substrate is provided, and the substrate has two gate structures and a metal stack between the gate structures, wherein each of the gate structures has a gate electrode and a dielectric helmet over the gate electrode. A first dielectric layer and a second dielectric layer are sequentially formed over the gate structures and the metal stack. An opening is formed to penetrate through the first dielectric layer and the second dielectric layer and exposes the metal stack. A metal layer is formed over the second dielectric layer and fills in the opening, wherein the metal layer includes Ru. A first polishing operation is performed with a first polishing slurry composition until the second dielectric layer is exposed. A second polishing operation is performed with a second polishing slurry composition until the first dielectric layer is exposed. A third polishing operation is performed with a third polishing slurry composition until the dielectric helmet is exposed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of polishing a metal layer, comprising:
   providing a substrate having a polishing stop layer and a target metal layer formed thereon; and
   polishing the target metal layer with a CMP slurry composition until the polishing stop layer is exposed, wherein the CMP slurry composition comprises a chelator, and the chelator comprises a thiol compound or a thiolether compound, and
   wherein an oxidizer is not present in the CMP slurry composition.

2. The method of claim 1, wherein the chelator is represented by a formula of $R_1$—S—$R_2$, wherein $R_1$ and $R_2$ each independently represent hydrogen, substituted or unsubstituted $C_1$-$C_{15}$ alkyl, substituted or unsubstituted $C_1$-$C_{15}$ alkoxyl or substituted or unsubstituted $C_6$-$C_{30}$ aryl.

3. The method of claim 1, wherein the polishing stop layer comprises SiN, SiCN, SiON, SiOCN, SiOC or SiC.

4. The method of claim 3, wherein the CMP slurry composition further comprises $CeO_2$ particles.

5. The method of claim 1, wherein the target metal layer comprises RuCo, RuW, Ru, Mo, Rh or Ir.

6. The method of claim 1, wherein the polishing stop layer comprises a nitride-based or carbon-based material.

7. The method of claim 1, wherein the CMP slurry composition comprises a cerium-containing abrasive.

8. The method of claim 7, wherein the cerium-containing abrasive comprises cerium oxide ($CeO_2$), cerium hydroxide, cerium nitride, cerium fluoride or cerium sulfide.

9. The method of claim 1, wherein a pH value of the CMP slurry composition is from 7 to 12.

10. A method of polishing a metal layer, comprising:
    providing a substrate having two gate structures and a metal stack between the gate structures, wherein each of the gate structures has a gate electrode and a dielectric helmet over the gate electrode;
    sequentially forming a first dielectric layer and a second dielectric layer over the gate structures and the metal stack;
    forming an opening that penetrates through the first dielectric layer and the second dielectric layer and exposes the metal stack;
    forming a metal layer over the second dielectric layer and filling in the opening, wherein the metal layer comprises Ru;
    performing a first polishing operation with a first polishing slurry composition until the second dielectric layer is exposed;
    performing a second polishing operation with a second polishing slurry composition until the first dielectric layer is exposed; and
    performing a third polishing operation with a third polishing slurry composition until the dielectric helmet is exposed.

11. The method of claim 10, wherein the first polishing slurry composition comprises:
    $TiO_2$ particles; and
    an oxidant.

12. The method of claim 10, wherein the second polishing slurry composition comprises:
    $CeO_2$ particles; and
    a chelator, comprising a thiol compound or a thiolether compound.

13. The method of claim 12, wherein an oxidizer is not present in the second polishing slurry composition.

14. The method of claim 10, wherein the third polishing slurry composition comprises:
    $SiO_2$ particles; and
    an oxidant.

15. A method of polishing a metal layer, comprising:
    providing a substrate, wherein the substrate has a target metal layer and a polishing stop layer formed aside the target metal layer; and
    polishing the target metal layer and the polishing stop layer simultaneously until the polishing stop layer is completely removed,
    wherein the CMP slurry composition comprises 0.1 to 10 parts by weight of an abrasive, and 0.1 to 10 parts by weight of a chelator, and
    wherein the chelator is represented by a formula of $R_1$—S—$R_2$, wherein $R_1$ and $R_2$ each independently represent hydrogen, substituted or unsubstituted $C_1$-$C_{15}$ alkyl, substituted or unsubstituted $C_1$-$C_{15}$ alkoxyl or substituted or unsubstituted $C_6$-$C_{30}$ aryl,
    wherein an oxidizer is not present in the CMP slurry composition.

16. The method of claim 15, wherein the abrasive comprises cerium oxide, cerium hydroxide, cerium nitride, cerium fluoride or cerium sulfide.

17. The method of claim 15, wherein the CMP slurry further comprises 0.1 to 10 parts by weight of a pH adjustor, and the pH adjustor comprises KOH or $R_1$—N—$R_2$, wherein $R_1$ and $R_2$ each independently represent hydrogen, substituted or unsubstituted $C_1$-$C_{15}$ alkyl, substituted or unsubstituted $C_1$-$C_{15}$ alkoxyl or substituted or unsubstituted $C_6$-$C_{30}$ aryl.

18. The method of claim 15, wherein a pH value of the CMP slurry composition is from 7 to 12.

19. The method of claim 15, wherein the target metal layer comprises RuCo, RuW, Ru, Mo, Rh or Ir.

20. The method of claim 15, wherein the polishing stop layer comprises SiN, SiCN, SiON, SiOCN, SiOC or SiC.

\* \* \* \* \*